(12) United States Patent
Goodnow et al.

(10) Patent No.: US 7,417,453 B2
(45) Date of Patent: Aug. 26, 2008

(54) SYSTEM AND METHOD FOR DYNAMICALLY EXECUTING A FUNCTION IN A PROGRAMMABLE LOGIC ARRAY

(75) Inventors: Kenneth J Goodnow, Essex Junction, VT (US); Clarence R Ogilvie, Huntington, VT (US); Christopher B Reynolds, Underhill, VT (US); Jack R Smith, S. Burlington, VT (US); Sebastian T Ventrone, S. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 11/181,053

(22) Filed: Jul. 14, 2005

(65) Prior Publication Data

US 2005/0251778 A1 Nov. 10, 2005

Related U.S. Application Data

(62) Division of application No. 10/605,603, filed on Oct. 13, 2003, now Pat. No. 6,954,085.

(51) Int. Cl.
*H03K 19/173* (2006.01)
(52) U.S. Cl. .......................................... 326/38; 326/47
(58) Field of Classification Search ............. 326/37–41, 326/47
See application file for complete search history.

(56) References Cited

U.S. PATENT DOCUMENTS 5,744,980 A * 4/1998 McGowan et al. ............ 326/40
7,054,967 B2 * 5/2006 Plants ......................... 710/100
7,111,110 B1 * 9/2006 Pedersen ..................... 711/104

OTHER PUBLICATIONS

Stream Computations Organized for Reconfigurable Execution (SCORE): Introduction and Tutorial; Eylon Caspi, Michael Chu, Randy Huang, Joseph Yeh, Yury Markovskiy, Andre DeHon, John Wawrzynek; Aug. 25, 2000/ Version 1.0; pp. 1-31.
Partitioning Sequential Circuits on Dynamically Reconfigurable FPGAs; Douglas Chang and Malgorzata Marek-Sadowska; IEEE Transactions on Computers, vol. 48, No. 6, Jun. 1999; pp. 565-578.

(Continued)

*Primary Examiner*—James H Cho
(74) *Attorney, Agent, or Firm*—Downs Rachlin Martin PLLC

(57) ABSTRACT

A reconfigurable logic array (RLA) system (104) that includes an RLA (108) and a programmer (112) for reprogramming the RLA on a cyclical basis. A function (F) requiring a larger amount of logic than contained in the RLA is partitioned into multiple functional blocks (FB1, FB2, FB3). The programmer contains software (144) that partitions the RLA into a function region FR located between two storage regions SR1, SR2. The programmer then programs functional region sequentially with the functional blocks of the function so that the functional blocks process in alternating directions between the storage regions. While the programmer is reconfiguring function region with the next functional block and reconfiguring one of the storage regions for receiving the output of the next functional block, data being passed from the current functional block to the next functional block is held in the other storage region.

5 Claims, 7 Drawing Sheets

OTHER PUBLICATIONS

Scheduling Designs into a Time-Multiplexed FPGA; Steve Trimberger; Association for Computing Machine; ACM/ Sigda International Symposium on Field Programmable Gate Arrays. FPGA '98; vol. 6th Conference; Feb. 22, 1998; pp. 153-160.

Managing Pipeline-Reconfigurable FPGAs; Srihari Cadambi, Jeffrey Weener, Seth Copen Goldstein, Herman Schmit, and Donald E. Thomas; ACM Sigda International Symposium on Field Programmable Gate Arrays; FPGA '98; vol. 6th Conf.; Feb. 22, 1998; pp. 55-64.

* cited by examiner

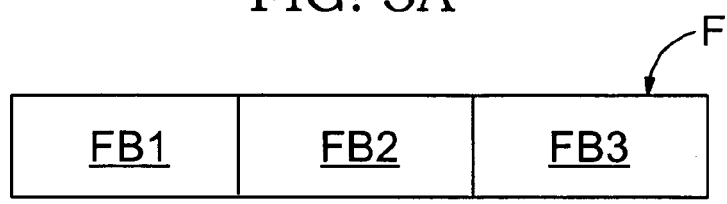
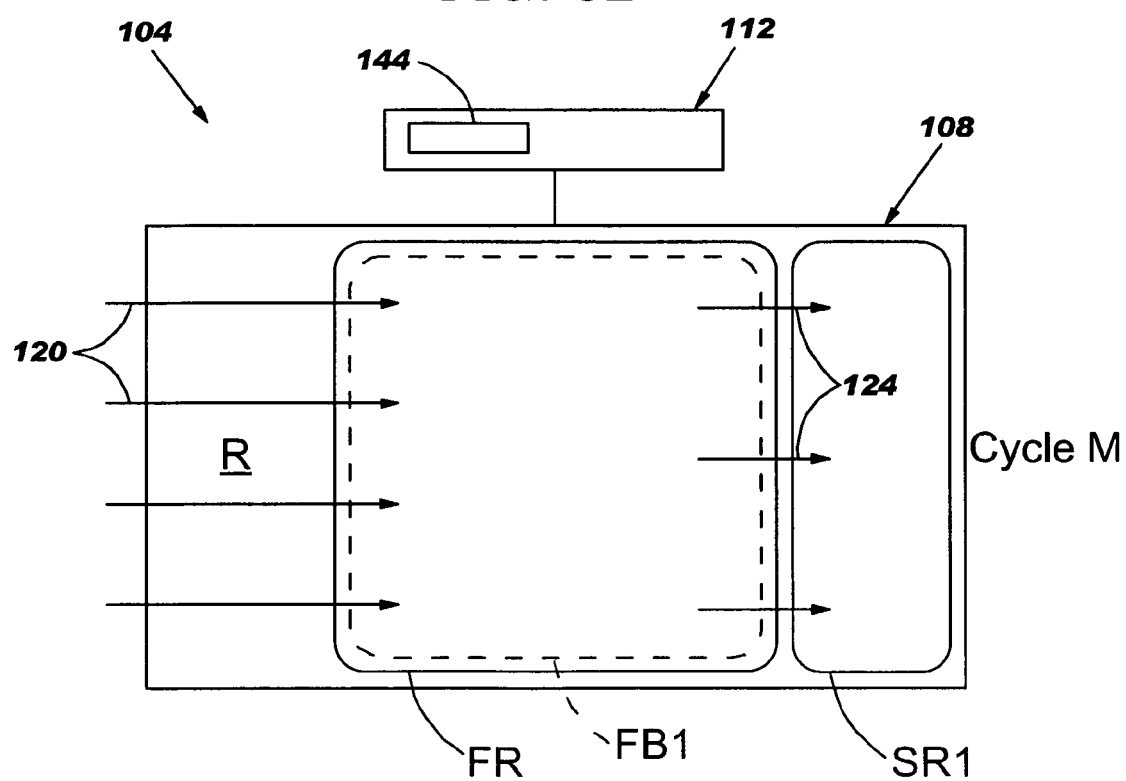

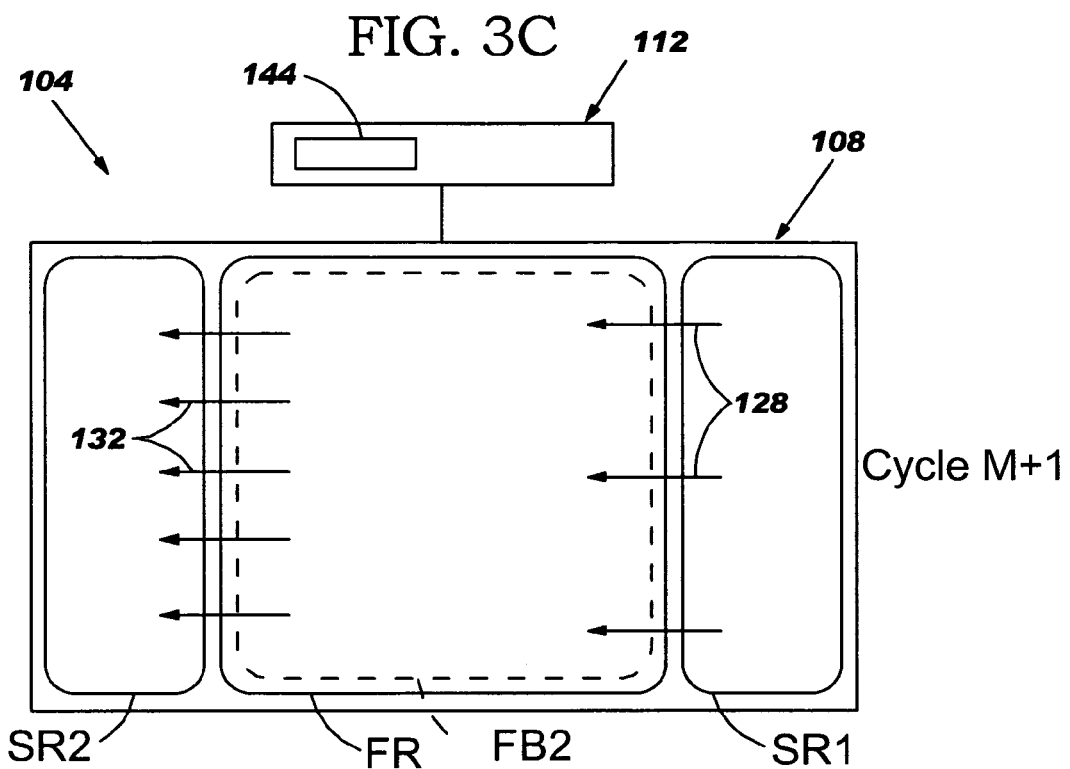
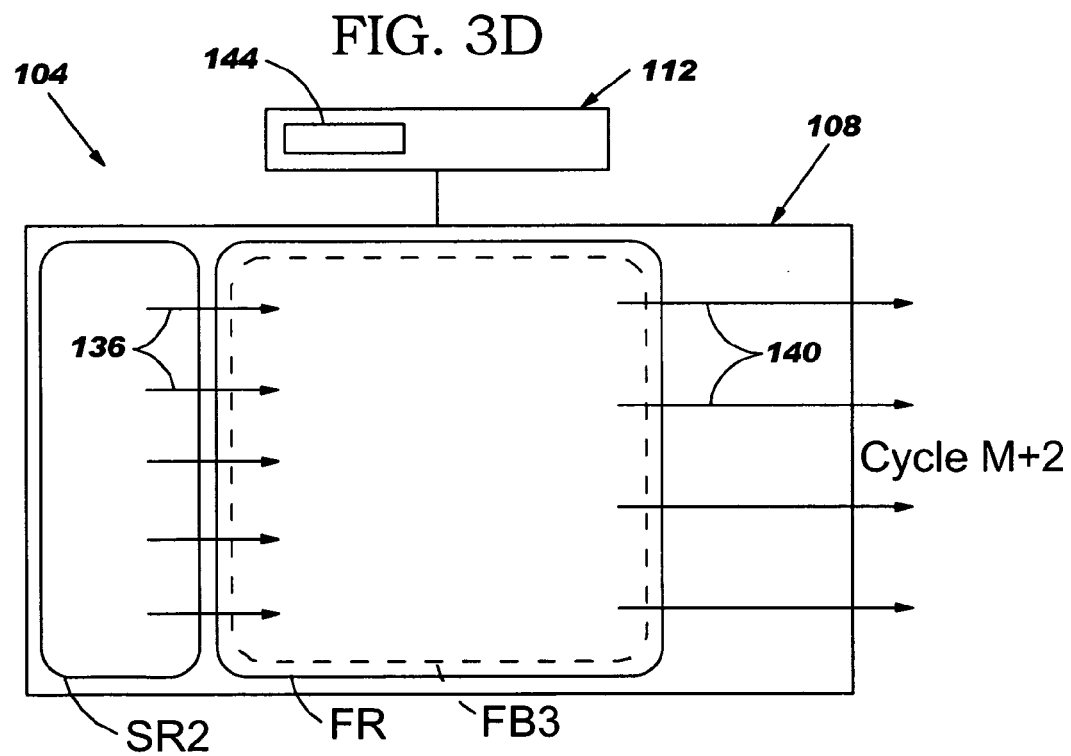

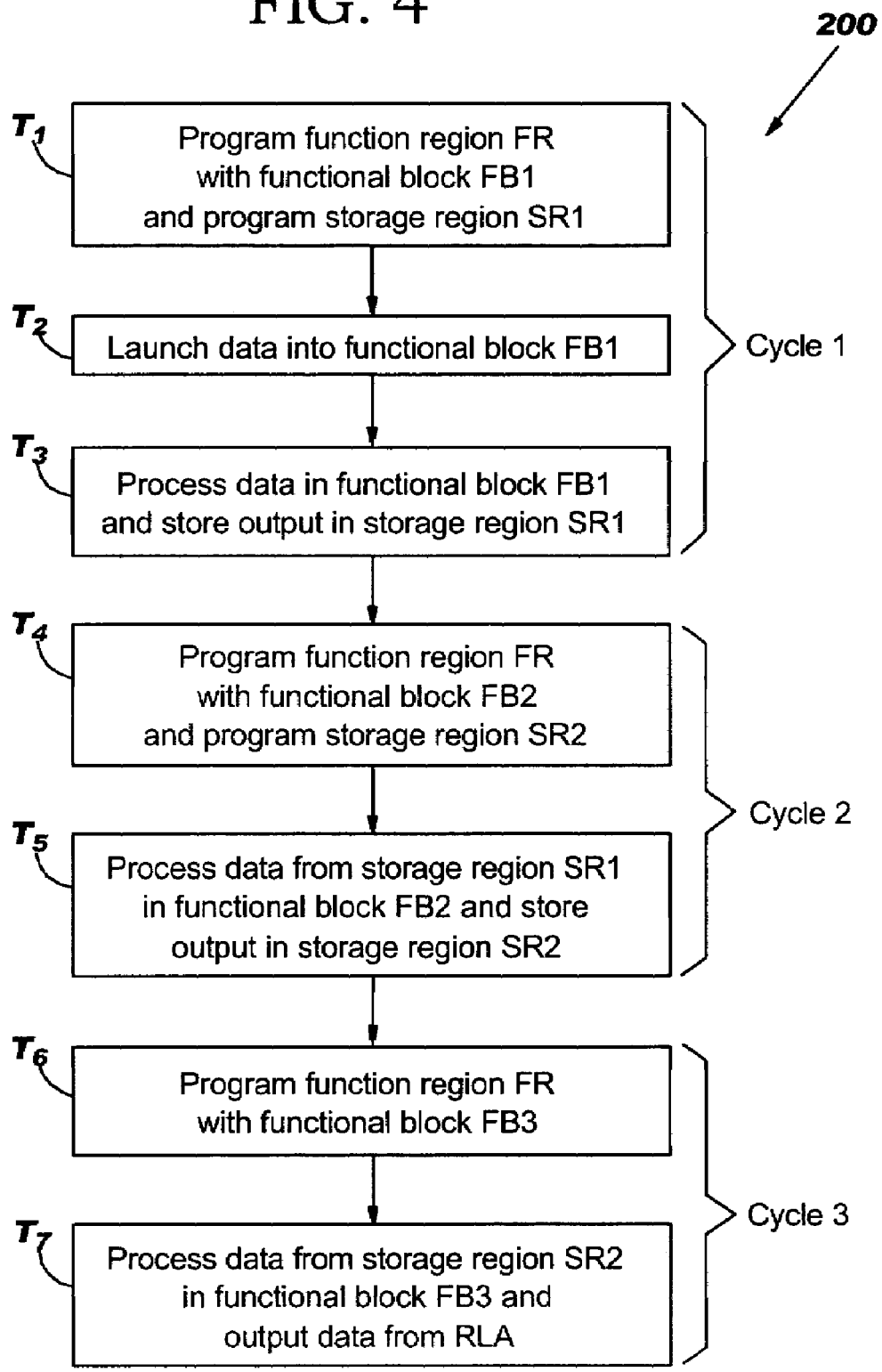

SYSTEM AND METHOD FOR DYNAMICALLY EXECUTING A FUNCTION IN A PROGRAMMABLE LOGIC ARRAY

RELATED APPLICATION

This application is a division of U.S. patent application Ser. No. 10/605,603, filed Oct. 13, 2003 (now U.S. Pat. No. 6,954,085), which is incorporated by reference herein in its entirety.

FIELD OF THE INVENTION

The present invention generally relates to the field of logic devices. More particularly, the present invention is directed to a system and method for dynamically executing a function in a programmable logic array.

BACKGROUND OF THE INVENTION

Recently, programmable logic devices, such as field programmable gate arrays (FPGAs), have evolved into devices capable of being dynamically reconfigured on a cycle-by-cycle basis to perform logic functions, or portion(s) thereof, during each cycle. With the increasing speed of such reconfigurable FPGAs (RFPGAs), RFPGAs are now being considered as components suitable for use in application specific integrated circuits (ASICs) and other integrated circuits (ICs). For example, ICs for applications that require certain data to be manipulated iteratively in order to produce a desired output are ICs that can benefit from the utilization of RFPGAs. Examples of such applications include communication protocol processing and image processing, among others.

A benefit of using an RFPGA to perform one or more functions that would otherwise be performed by fixed logic is often a reduction in the amount of chip area needed to perform these functions. For example, a certain function may be partitioned into ten functional blocks that are chained together such that the output of one block becomes the input to the next block, and so on. Using conventional fixed logic, all ten of these functional blocks would typically be placed on the chip next to one another in their proper data-flow sequence. Using an RFPGA solution, however, these ten functional blocks can be replaced with a single RFPGA that is cyclically reconfigured to process each of the ten functional blocks in the proper sequence.

Generally, the processing of the ten functional block function proceeds as follows. The RFPGA is configured for the first functional block and the input data of the function is passed into the RFPGA, i.e., the first functional block. The output of the first functional block then passes out of the block and is stored in certain storage elements created within the RFPGA. These storage elements store the output of the first functional block for use as the input to the second functional block of the function, which is created by reconfiguring portions of the RFPGA other than storage elements. At the same time portions of the RFPGA are being reconfigured for the second functional block, other portions of the RFPGA are reconfigured as storage elements for storing the output of the second functional block, which is also the input for the third functional block. This process is repeated for the third through the ninth functional blocks. The process for the tenth, and final, functional block is slightly different, with the output of the tenth functional block being passed to the external I/O elements of the RFPGA, where the output is passed to other portions of the IC.

While processing multiple functional blocks in series using an RFPGA is conceptually straightforward, conventional RFPGA reconfiguration techniques make it difficult to optimize each of the various configurations of the RFPGA needed to perform a given function. However, optimizing IC designs is important. This difficulty in optimizing configurations of an RFPGA is largely due to the way in which conventional techniques handle the data being passed from one configuration of logic, i.e., functional block, to the next configuration of logic.

FIG. 1 illustrates the configuration of an RFPGA 20, respectively, when configured for the Mth functional block of a function consisting of three or more functional blocks. As a convention, the current functional block, i.e., the functional block configured in RFPGA 20 at a given time, will be referred to as the Mth functional block. Thus, if the Mth functional block is the second functional block, the first functional block is referred to as the "M−1" functional block, the third functional block is the "M+1" functional block, the fourth functional block is the "M+2" functional block, and so on. Each functional block other than the first and last functional block will have associated therewith "M−1" storage elements, i.e., the outputs of the "M−1" functional block, which are the inputs to the Mth functional block, and "M" storage elements, which contain the outputs of the Mth functional block. The first functional block does not need any "M−1" storage elements since the input to the first functional block comes from circuitry (not shown) located outside RFPGA 20 via I/O elements 24, and the last functional block does not need any "M" storage elements since the output of the last functional block is passed out of the RFPGA. The same nomenclature is also to be applied to the cycling of the functional blocks from one to the next as reconfiguration and processing proceed. For example, if the reference cycle is denoted the "M" cycle, the immediately prior cycle is the "M−1" cycle and the next cycle is the "M+1" cycle.

RFPGA 20 generally includes an array of configurable logic blocks (CLBs) 28, or other (re)programmable logic elements, interconnected to one another via interconnect resources 32. CLBs 28 are the reconfigurable functional elements, e.g., logic gates, used to implement the logic of each functional block of the desired function and the storage elements needed to store data being passed from one functional block to the next. Each CLB 28 programmed as a functional element is shown as a square containing an "F," each CLB programmed as a corresponding "M−1" storage element is shown as a square containing an "M−1" and each CLB programmed as a corresponding "M" storage element is shown as a square containing an "M." RFPGA 20 is in electrical communication with I/O cells 24, which provide communication between the RFPGA and other circuits (not shown), e.g., memory, processor, communication or other circuits.

As shown in FIG. 1, conventional RFPGA programming techniques result in storage elements M−1, M of the first functional block being scattered across the array of CLBs 28 at locations that locally optimize the logic paths through functional elements. The problem with this approach begins to appear, however, when a programmer 36 responsible for reconfiguring (programming) RFPGA 20 with each set of functional block and storage elements goes to reprogram the RFPGA with the second (and subsequent) functional blocks and corresponding storage locations. To reprogram RFPGA 20, programmer 36 must take into account the locations of scattered storage elements M so as to not interfere with the data stored there, which is the input to the next functional block. The process of optimizing a functional block and its storage elements is hampered by the scattered nature of the storage elements from the previous functional block.

The scattered nature of storage elements M−1, M also degrades the overall performance and cycle time of the function being processed by RFPGA 20. The length of delay from a storage element to the worst-case entry point into the next functional block becomes the limiting factor in the cycle time of RFPGA 20. Moreover, depending upon the path delay per cycle, the cycle time would vary from one cycle to the next. This could cause the worst cycle frequency to determine the overall processing speed of the function. This problem is directly dependent on the placement of the storage elements to determine the operating frequency of the function.

The ability of the programmer to place storage elements at appropriate locations to facilitate fast cycle times becomes dependent on not just the current functional block configuration requirements, but also on all subsequent functional block configuration requirements. That is, the locations of storage elements for the current functional block configuration affects the locations of the storage elements for the next functional block configuration, which affects the locations of storage elements for the following functional block configuration, and so on. This creates a combinatorial explosion of possible options for which the programmer must find a maximum cycle time for each cycle and an overall cycle time. For complex functional blocks, conventional RFPGA programmers can take several hours to produce a viable solution for one functional block configuration or cycle. It is readily seen that achieving a viable solution for multiple functional block configurations can require a prohibitive amount of time. A need therefore exists for configuring functional blocks in an efficient manner.

SUMMARY OF THE INVENTION

In one aspect, the present invention is directed to a system for processing a logic function comprising a plurality of functional blocks each having output data. The system comprises a first storage region, a second storage region and a reconfigurable logic array having defined therein a function region located outside the first and second storage regions. A programmer is in communication with the reconfigurable logic array and operatively configured to program the function region with ones of the plurality of functional blocks on a cyclical basis such that the output of successive ones of the plurality of functional blocks is stored in the first and second storage regions on an alternating basis.

In another aspect, the present invention is directed to a method of processing a function partitioned into a plurality of functional blocks. The method comprises the step of programming a reconfigurable logic array with a first one of the plurality of functional blocks so that the first one of the plurality of functional blocks processes in a first direction. Then, the first one of the plurality of functional blocks is processed in the first direction. The reconfigurable logic array is programmed with a second one of the plurality of functional blocks so that the second one of the plurality functional blocks processes in a second direction substantially opposite the first direction. The second one of the plurality of functional blocks is processed in the second direction.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 3A is a high-level schematic diagram of a partitioned function that may be processed by the RLA system of FIG. 2;

FIGS. 3B-3D are high-level schematic diagrams of the RLA system of FIG. 2 wherein the RLA is configured, respectively, for processing the first, second and third functional blocks of the function illustrated in FIG. 3A;

FIG. 4 is a timing diagram illustrating the cyclical programming of the RLA of FIGS. 3B-3D for processing the function of FIG. 3A;

DETAILED DESCRIPTION OF THE DRAWINGS

Figure 1:
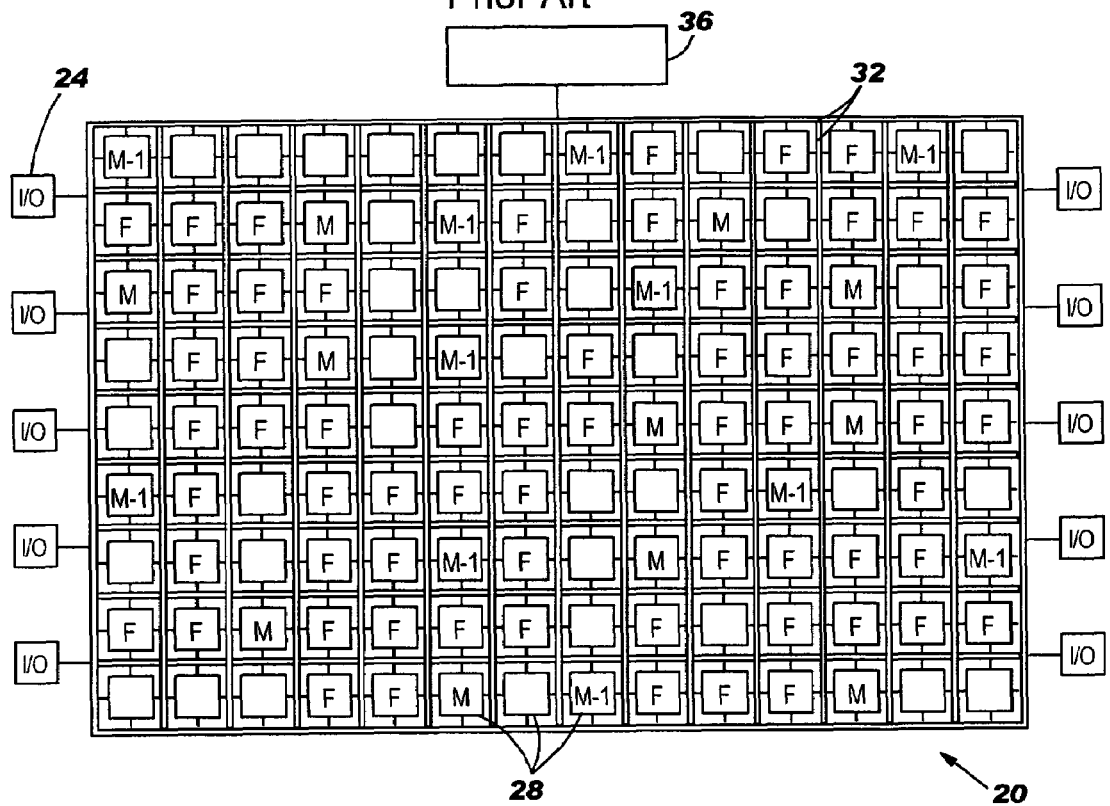
FIG. 1 is a schematic diagram of a reconfigurable field programmable gate array (RFPGA) configured in accordance with the prior art for one functional block of a function having a plurality of functional blocks.
Figure 2:
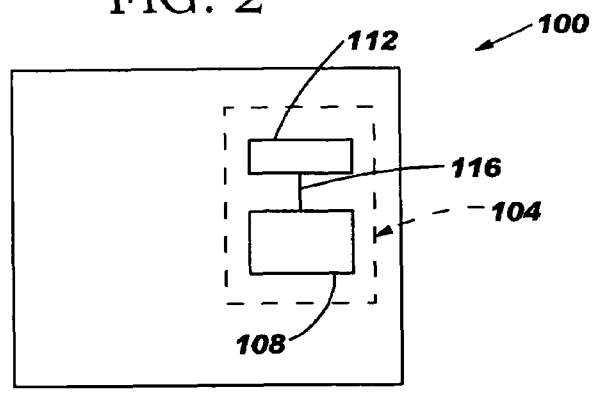
FIG. 2 is a schematic diagram of an integrated circuit chip containing a reconfigurable logic array (RLA) system of the present invention.

Referring now to the drawings, FIG. 2 shows in accordance with the present invention an integrated circuit (IC) chip, which is identified generally by the numeral 100. Chip 100 may be any type of IC chip, such as a logic chip, an application specific IC (ASIC) chip, or microprocessor chip, among others. Chip 100 contains at least one reconfigurable logic array (RLA) system 104 that includes an RLA 108 and a programmer 112 for reconfiguring the logic structure of the RLA. RLA 108 may be any suitable logic array, e.g., a field programmable gate array (FPGA), that may be cyclically reconfigured to implement any logic cone having a size that can be accommodated by the RLA. Although not illustrated, RLA 108 may include a plurality of reprogrammable logic elements (RLEs) that may be the same as or generally similar to CLBs 28 of the prior art RFPGA 20 illustrated in FIG. 1. As is well known in the art, the RLEs generally are the elements of RLA 108 that are reconfigurable to function as various logic gates or logic blocks, depending upon the granularity of the RLA. Programmer 112 is in electrical communication with the RLEs via configuration circuitry 116. As discussed below in detail, the function of programmer 112 is to reconfigure the RLEs on a periodic basis to configure RLA 108 so that it contains one or more particular logic function(s), or portion(s) thereof, and corresponding storage elements, if needed.

As discussed in the background section above, a logic function that is larger than the size that a particular RLA can process in a single configuration cycle can be partitioned into a number of functional blocks each having a size small enough to be processed in one cycle of the RLA. In contrast to a conventional programmer, e.g., programmer 36 of FIG. 1, that scatters storage elements throughout the logic array, as discussed below in detail, programmer 112 of the present invention essentially configures within RLA 108 (among the RLEs) at least a function region and, typically except for the last one of the functional blocks, a corresponding storage region for storing and holding output from the function region.

Referring to FIG. 3A, consider a function F partitioned into three functional blocks FB1, FB2, FB3. Of course, those skilled in the art will appreciate that the number of functional blocks is dependent upon the size of the function and the size of the region of the RLA devoted to functional logic and that the number of functional blocks may be any integer greater than one. However, for simplicity, the present explanation is limited to three functional blocks FB1, FB2, FB3. Those skilled in the art will readily understand how to make the changes necessary to implement any other number of functional blocks.

As illustrated by FIG. 3B, during the first configuration cycle, i.e., cycle M, programmer 112 configures function region FR with functional block FB1 and a corresponding storage region SR1 for receiving the output of FB1, leaving a region R of RLA 108 outside of the function and storage regions unconfigured (in terms of logic or storage configuration) for being configured in the next configuration cycle, cycle M+1, as storage region SR2 (FIG. 3C). (It is noted that in other embodiments, storage region SR2 of FIG. 3C could be configured during cycle M, if desired.) Input data, represented by arrows 120, is then passed into RLA 108 and processed by functional block FB1. The output data of functional block FB1, represented by arrows 124, passes from functional block FB1 to storage elements (not shown) within storage region SR1.

On the second configuration cycle (FIG. 3C), cycle M+1, programmer 112 reconfigures function region FR with functional block FB2 and configures storage region SR2 for receiving the output of functional block FB2. Programmer 112 essentially leaves storage region SR1 alone, except for making the appropriate connections between the storage cells therein and functional block FB2, so as to not disturb the output data of functional block FB1, which is the input data for functional block FB2. Once programmer 112 has configured function region FR and storage region SR2, RLA 108 enters into a processing cycle during which the data stored in storage region SR1 passes into (arrows 128) functional block FB2 and corresponding output data, represented by arrows 132, passes from functional block FB2 into storage elements (not shown) within storage region SR2.

On the third configuration cycle (FIG. 3D), cycle M+2, programmer 112 reconfigures function region FR with functional block FB3 and any connections needed with the storage elements within storage region SR2 so that the output data of FB2 of the previous cycle can be input into FB3. Since function F under consideration has only three functional blocks FB1, FB2, FB3, programmer 112 need not reconfigure storage elements within storage region SR1, since the output of functional block FB3 can be passed directly out of RLA 108. Once programmer 112 has reconfigured function region FR, RLA 108 enters into an execution cycle during which the data stored in storage region SR2 passes into (arrows 136) functional block FB3 and corresponding output data, represented by arrows 140, passes from functional block FB3 out of the RLA.

To maximize the speed at which programmer 112 can configure function region FR with functional blocks FB1, FB2, FB3, each configuration of the function region, i.e., the configuration for functional block FB1, the configuration for functional block FB2 and the configuration for functional block FB3, may be "precompiled" and stored in a memory (not shown). In this manner, programmer 112 simply "loads" function region with the appropriate precompiled configuration during each cycle. Alternatively, programmer 112 may be configured to determine the necessary configuration for function region FR during each cycle. Factors to be considered in determining which of these alternatives is more appropriate for a particular design include the cycle time, size of function array FR and amount of memory available for storing the precompiled configurations. Of course, it may also be desirable for programmer 112 to implement a hybrid of these alternatives wherein certain logic segments used over and over again are precompiled but the programmer determines the overall configuration for each functional block FB1, FB2, FB3 during each cycle.

Those skilled in the art will readily understand how the multi-cycle reconfiguration and processing method just described can be generalized to a function having any number of functional blocks. For a function having more than three functional blocks, there will obviously be more configuration and processing cycles during which the additional functional block(s) are configured and data is processed through the additional functional blocks. With the configuration of function region FR and storage regions SR1, SR2 shown in FIGS. 3B-3D, the odd-numbered functional blocks, e.g., functional blocks FB1 and FB3, will be executed from left to right, whereas the even-numbered functional blocks, e.g., FB2, will be executed from right to left. This orderly process of configuring and executing the various functional blocks of a given function within function region FR and designating, using and reusing storage regions SR1, SR2 as needed, allow the processing of function F to be readily optimized.

Although the configuration and execution of functional blocks, e.g., functional blocks FB1, FB2, FB3, has been described in the context of left-to-right, right-to-left execution, storage regions SR1, SR2 can be located anywhere relative to function region FR. For example, storage regions SR1, SR2 can be reversed so that execution of the functional blocks proceeds right-to-left and then left-to-right and so on, or storage regions SR1, SR2 may be located above and below function region FR so that processing of the functional blocks proceeds either top-to-bottom, bottom-to-top or bottom-to-top, top-to-bottom. Other processing configurations are also possible, such as left-to-top, top-to-left, but may not be desirable due to unacceptable delays in the longer logic paths through the corresponding functional block. The processing direction of the functional block will generally depend upon the design of the particular RLA utilized. Conventional RLEs are typically relatively asymmetric in terms of processing efficiency, i.e., the processing speed in one direction is much faster than the processing speed in the opposite direction. However, RLEs may be designed to have processing symmetry in two or four directions, e.g., left-to-right, right-to-left or top-to-bottom, bottom-to-top or both.

Programmer 112 may run any software 144 suitable for periodically configuring function region FR with the functional blocks, e.g., functional blocks FB1, FB2, FB3. Software 144 may utilize existing software modules/routines to perform the low level tasks necessary to configure function region FR and storage regions SR1, SR2. Such modules/routines are well known in the art. At a higher level, new software modules/routines must be written for software 144 in order to implement the function processing scheme of the present invention, whereby distinct, coherent function region FR and storage regions SR1, SR2 are designated and reconfigured as needed during periodic configuration cycles. With the present disclosure as a guide for generating these high-level routines, those skilled in the art will readily be able to write software 144 necessary for programmer 112 to provide the functionality described herein.

In order to optimize a particular design of RLA system 104, it will often be desired to place storage regions SR1, SR2 as close to corresponding edges of RLA 108 and also to maximize the size of function region FR and minimize the sizes of the storage regions. When this is done, a method of determining the sizes (in terms of RLEs) of function region FR and storage regions SR1, SR2 when function contains X processing logic elements and RLA contains Y programmable logic elements, may proceed as follows. First, the maximum number of storage elements SE needed for storage regions SR1, SR2 is subtracted from the Y logic elements of RLA 108 to yield a maximum number Z of logic elements that can be implemented per cycle. (The maximum number of storage elements can be approximated or determined by the maximum number of data paths.)

Then, the X logic elements of function F may be divided by the Z function logic elements to determine the number W of functional blocks into which the function will be partitioned (which also equals the number of cycles for configuring and processing the function). Of course, W must be an integer, such that any remainder must be rounded to the next highest integer. For each cycle, the inputs and outputs are defined. The maximum number of outputs for all W cycles can then be compared with the number SE of storage elements used to determine the number Z of programmable logic elements. This can be an iterative process with possible trade-offs for smaller Z values to achieve a smaller maximum number of storage elements needed. The configuration of the Z logic elements for each of the W cycles may then be optimized and configured for the alternating directional flow of data discussed above in connection with FIGS. 3B-3D. The processing time to complete the partitioning of function F and the per-cycle optimization, placement and wiring becomes M cycles rather than the combinatorial explosion discussed in the background section above relative to conventional multi-cycle RLA processing.

Referring to FIG. 4, and also to FIGS. 3A-3D, FIG. 4 illustrates a timing diagram 200 for the three-cycle processing of function F as comprising a plurality of timing segments $T_1$-$T_7$. During timing segment $T_1$, programmer 112 programs function region FR of RLA 108 with functional block FB1 and storage region SR1 with storage elements. Once programmer 112 has programmed RLA 108 as required, data may be launched during timing segment $T_2$ into functional block FB1 for processing. During timing segment $T_3$, functional block FB1 processes the launched data and outputs data to storage region SR1. Timing segments $T_1$ through $T_3$ may be considered cycle 1 of RLA 108 relative to processing of function F, since all programming and processing relating to functional block FB1 occurs in these timing segments.

During timing segment $T_4$, programmer 112 programs function region FR with functional block FB2 and programs storage region SR2 with the necessary storage elements. Also during timing segment $T_4$, data in storage region SR1 output from functional block FB1 is held in state within storage region SR1 while programmer 112 programs function region FR and storage region SR2. During timing segment $T_5$, data from SR1 is processed by functional block FB2, and the output of functional block FB2 is stored in SR2. Since the programming and processing relating to functional block FB2 are performed during timing segments $T_4$ and $T_5$, these two timing segments may be considered as forming cycle 2 relative to processing of function F.

During timing segment $T_6$, programmer 112 programs function region FR with functional block FB3. Also during timing segment $T_6$, data in storage region SR2 output from functional block FB2 is held in state within storage region SR2 while programmer 112 programs function region FR. During timing segment $T_7$, data from SR2 is processed by functional block FB3, and the output of functional block FB2 is passed out of RLA 108. Since the programming and processing relating to functional block FB3 are performed during timing segments $T_6$ and $T_7$, these two timing segments may be considered as forming cycle 3 relative to processing of function F. Again, while this example has been limited to function F having three functional blocks FB1, FB2, FB3 and, consequently, requiring three cycles 1, 2, 3, those skilled in the art will readily appreciate that the present invention can be modified to handle functions having any number of functional blocks and corresponding cycles.

Figure 5:
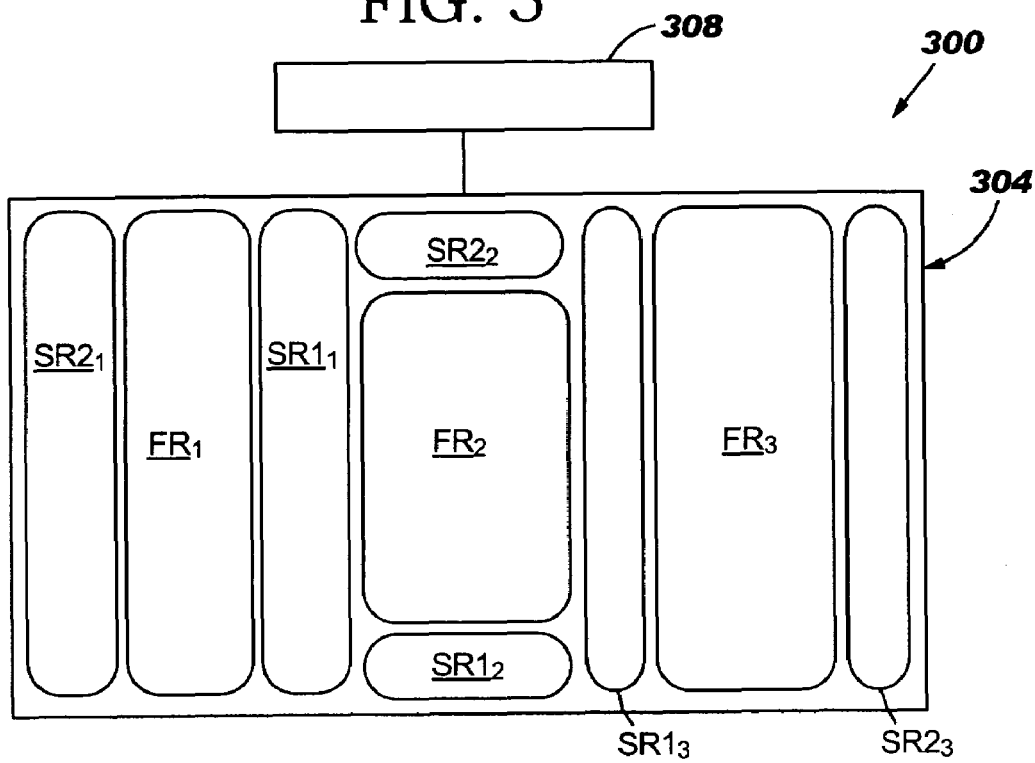
FIG. 5 a high-level schematic diagram of an RLA system of the present invention wherein some of the storage regions are not located at the edge of the RLA and functional blocks of multiple functions are programmed and processed simultaneously with one another.

Whereas RLA system 104 of the present invention discussed above in connection with FIGS. 3 and 4 is generally shown and described as having storage regions SR1, SR2 located proximate edges of RLA 108, this need not be the case. FIG. 5 illustrates an RLA system 300 of the present invention wherein some of the storage regions $SR1_n$, $SR2_n$ are not located adjacent edges of RLA 304. In this example, programmer 308 may program RLA 304 for processing multiple functional blocks each corresponding to a different function, e.g., functions $F_1$, $F_2$, $F_3$ (not shown), simultaneously with one another. Similar to function F discussed above in connection with FIGS. 3 and 4, each function $F_1$, $F_2$, $F_3$ may have associated therewith a corresponding function region $FR_n$ and corresponding storage regions $SR1_n$, $SR2_n$ that may have similar structure and functionality to the structure and functionality described above in connection with function region FR and storage regions SR1, SR2 relative to FIGS. 3 and 4. Accordingly, during each cycle, programmer 308 would program each of function regions $FR_1$, $FR_2$, $FR_3$ with the corresponding functional blocks of functions $F_1$, $F_2$, $F_3$, respectively, and these functional blocks would be processed and data therefrom stored in the corresponding appropriate storage region $SR1_n$, $SR2_n$ or passed out of RLA 304, as the case may be.

It is noted that to optimize the performance of RLA 304, it would be advantageous that the RLA be designed to process symmetrically from left-to-right and right-to-left as well as top-to-bottom and bottom-to-top. Of course, RLA 304 may be programmed in a configuration other than the quad-directional configuration shown. For example, if RLA 304 were designed for top-to-bottom and symmetrical bottom-to-top processing, it may be desirable to process all three of functions $F_1$, $F_2$, $F_3$ vertically. Similarly, if RLA 304 and its RLEs were designed for left-to-right and symmetrical right-to-left processing, it may be desirable to process all three of functions $F_1$, $F_2$, $F_3$ horizontally. Of course, even if RLA 304 is not symmetric in terms of processing efficiency in any direction, the functional blocks of functions $F_1$, $F_2$, $F_3$ may nevertheless be cycled simultaneously with one another, but perhaps with delay caused by slower processing in the less efficient direction(s).

Figure 6:
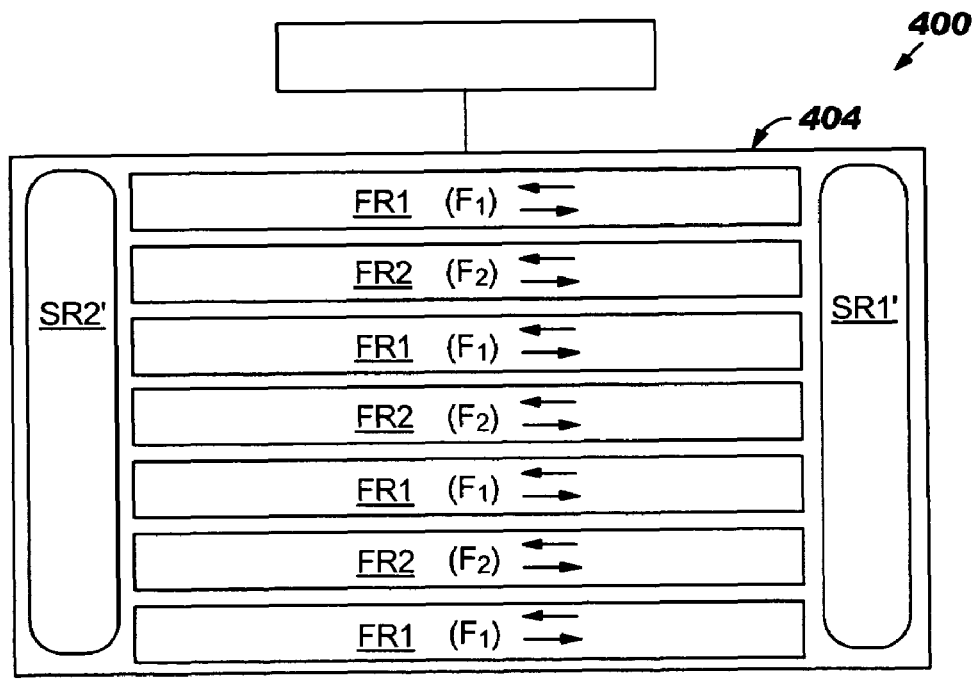
FIG. 6 is a high-level schematic diagram of an RLA system of the present invention wherein two functions share the same storage regions and are processed simultaneously in opposite directions from one another.

FIG. 6 illustrates another RLA system 400 of the present invention wherein RLA 404 processes two functions, e.g., functions $F_1$, $F_2$ simultaneously with one another, but in opposite directions. The design of RLA system 400 recognizes the fact that when an RLA, such as RLA 108 of FIGS.

3B-3D, processes only one function, data being "passed" from one functional block M to the next functional block M+1 must be held in one or the other of storage regions SR1, SR2 (FIG. 3C). Thus, the RLEs being used to hold the data during reconfiguration of function region FR from functional block M to functional block M+1 are not available for use during the processing of functional block M+1. In general, RLA system 400 of FIG. 6 utilizes these RLEs during each processing cycle, as opposed to every other processing cycle as discussed above relative to FIGS. 3-5, by processing two functions $F_1$, $F_2$ simultaneously in two different directions. Thus, during each processing cycle, the storage elements (not shown) of storage regions SR1', SR2' would be clocked with new data each processing cycle. It is noted that this bi-directional processing would typically not be optimized for each processing cycle, but rather would need to be optimized across two consecutive cycles, e.g., cycles M, M+1.

Figure 7A:
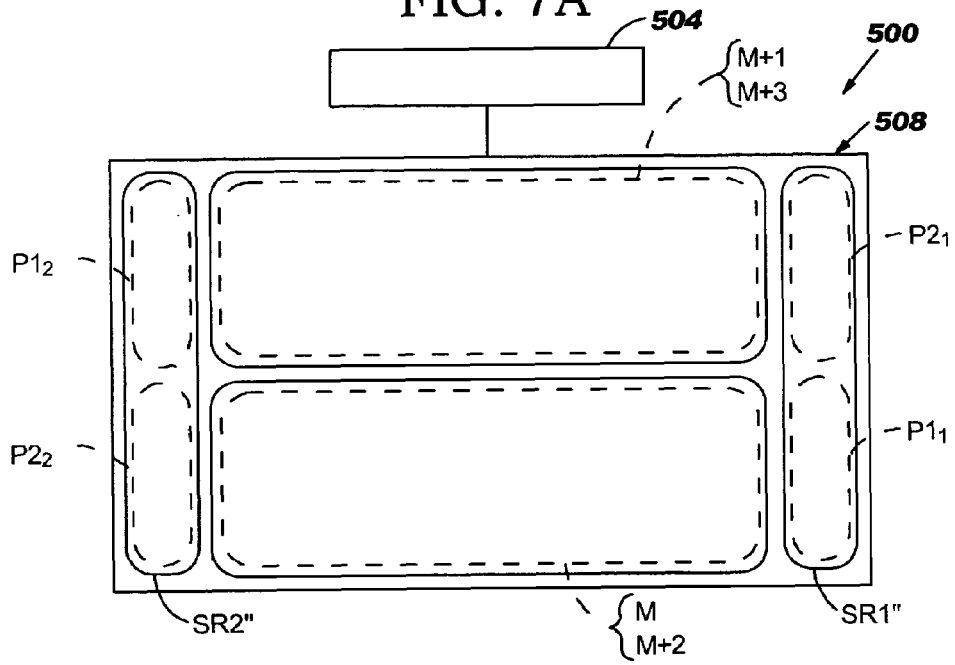
FIG. 7A is a high-level schematic diagram of an RLA system of the present invention wherein the RLA contains two function regions so that one function region can be programmed while the other function region is processing.

FIG. 7A illustrates a further RLA system 500 of the present invention wherein programmer 504 configures RLA 508 to contain two function regions FR1', FR2' for processing successive functional blocks of a function having a plurality of functional blocks, e.g., functional blocks M through M+n. Referring back to timing diagram 200 of FIG. 4, it is seen that each of cycles 1, 2 and 3 includes a programming step in timing segments $T_1$, $T_4$ and $T_6$, respectively, followed by a processing step in timing segments $T_3$, $T_5$ and $T_7$, respectively. Accordingly, during each of these timing segments, or cycles, RLA system 104 of FIGS. 3B-3D is either in a programming state or in a processing state. With the two function regions FR1', FR2' of RLA system 500, however, programmer 504 can be configured to program one of the function regions while the other function region is processing the corresponding functional blocks.

Programmer 504 is also configured for setting up and reprogramming storage regions SR1", SR2". For functional blocks other than the very first and the very last for which data may be passed directly into and directly out of, respectively, the functional block without needing to be held in one of storage regions SR1", SR2", first portions $P1_1$, $P1_2$ of the storage elements (not shown) of respective storage regions SR1", SR2" must hold data generated by the current functional block M in one of the function regions FR1, FR2 while second portions $P2_1$, $P2_2$ of the storage elements of the respective storage regions are being reconfigured to receive data from functional block M+2.

Figure 7B:
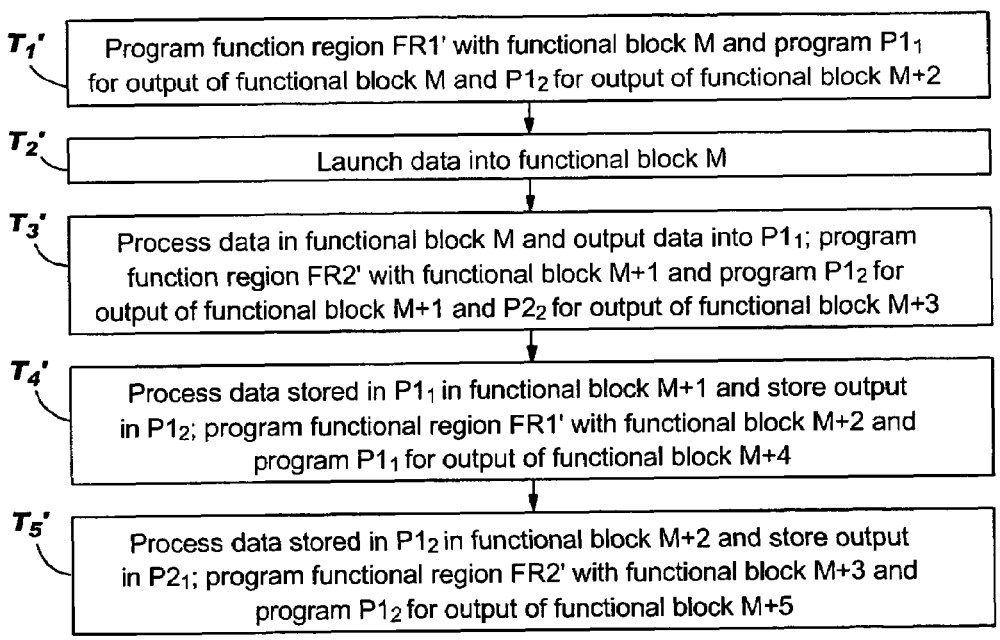
FIG. 7B is a timing diagram for processing a function using the dual-functional-region structure of FIG. 7A.

FIG. 7B illustrates a timing diagram 600 for RLA system 500 of FIG. 7A. At the beginning of the processing of a function (not shown) having a number of functional blocks, processing of the function may begin at timing segment $T_1'$ wherein programmer 504 programs function region FR1' with functional block M and portions $P1_1$ and $P2_1$ of storage region SR1" with, respectively, storage elements for functional block M and functional block M+2. At timing segment $T_2$, data is launched into functional block M. Functional block M is processed during timing segment $T_3'$. Simultaneously, programmer 504 programs function region FR2" with functional block M+1 and portions $P1_2$ and $P2_2$ of storage region SR2" with, respectively, storage elements for functional block M+1 and functional block M+3. During timing segment $T_4'$, functional block M+1 is processed such that the output of functional block M+1 is stored in portion $P1_2$ of storage region SR2". Simultaneously with the processing of functional block M+1, programmer 504 reconfigures function region FR1' with functional block M+2 and reconfigures portion $P1_1$ of storage region SR1" with storage elements for functional block M+4.

During the following timing segment $T_5'$, functional block M+2 is processed such that the output of functional block M+2 is stored in portion $P2_1$ of storage region SR1". Simultaneously with the processing of functional block M+2, programmer 504 reconfigures function region FR2' with functional block M+3 and reconfigures portion $P1_2$ of storage region SR2' with storage elements for functional block M+5. This alternating programming of function regions FR1', FR2' with successive functional blocks and the corresponding programming of storage elements for functional blocks two blocks ahead proceeds until functional block M+n−2 is reached. At that time, storage elements for functional block M+n need not be programmed because the outputs of functional block M+n may be passed directly out of RLA 508, if desired. However, functional blocks M+n−1 and M+n must still be programmed into function regions SR1", SR2" for subsequent execution. Those skilled in the art will appreciate that timing diagrams other than timing diagram 600 are possible.

Figure 8:
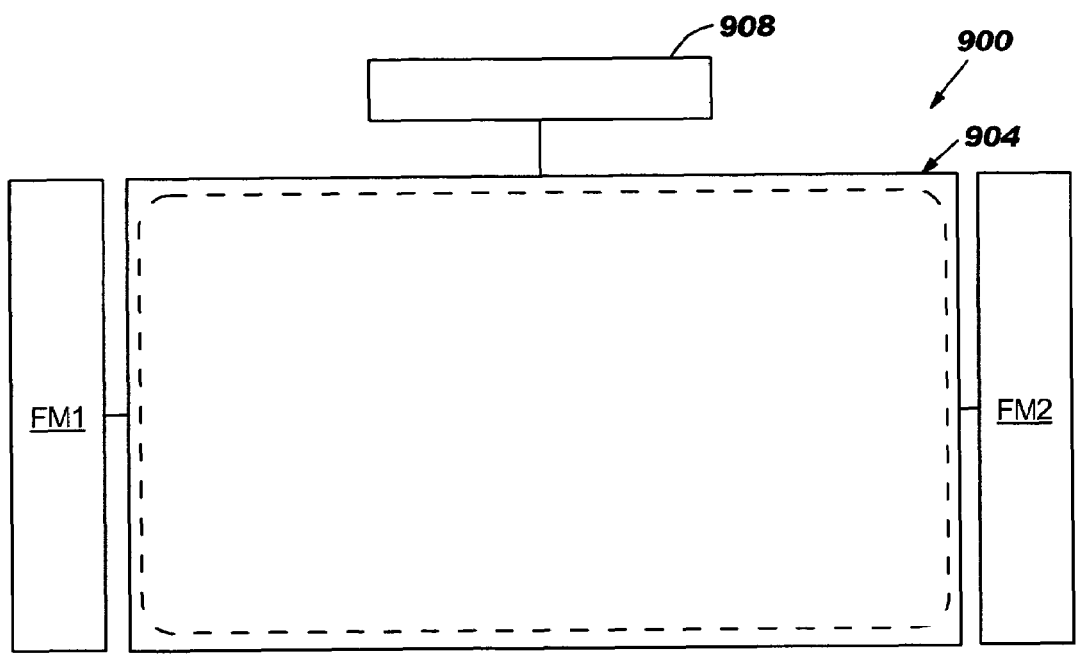
FIG. 8 is a high-level schematic diagram of an RLA system of the present invention wherein the storage elements are fixed memories.

FIG. 8 shows yet another RLA system 900 of the present invention. Similar to the RLA systems 104, 300, 400, 500 discussed above relative to FIGS. 3-7, RLA system 900 includes an RLA 904 and a programmer 908 for reconfiguring the RLA on a cyclical basis. However, instead of programmer 908 programming RLA 904 to contain various storage regions, e.g. storage regions SR1, SR2 of FIGS. 3B-3C, RLA system 900 utilizes fixed memories FM1 and FM2 located adjacent the RLA. In general, RLA 904 can be programmed to function in a manner very similar to RLA systems 104, 300, 400, 500 discussed above in connection with FIGS. 3-7, the primary difference being that programmer 908 does not configure fixed memories FM1, FM2 in the manner discussed relative to the other RLA systems since the fixed memories do not contain RLEs, but rather fixed storage elements. Fixed memories FM1, FM2 may be of any suitable type, such as SRAM, register array or flip-flop, among others. Those skilled in the art will readily understand how to interface fixed memories FM1, FM2 with RLA 904, such that a detailed explanation need not be provided herein for those skilled in the art to implement RLA system 900.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

What is claimed is:

1. A reconfigurable logic array having a logic capacity and processing a function whose logic requirements exceed the logic capacity of the reconfigurable logic array, comprising:
    (a) a plurality of programmable logic elements, at least some of said programmable logic elements configured with an Mth functional block of the function, said Mth functional block having output data and a first edge; and
    (b) a first storage region located adjacent said first edge and containing said output data;
    wherein a first portion of said plurality of programmable logic elements is configured with a first functional block of a first function and a second portion of said plurality of programmable logic elements is configured with a second functional block of a second function whose logic requirements exceed the logic capacity of the reconfigurable logic array.

2. A reconfigurable logic array of claim 1, wherein said Mth functional block has a second edge spaced from said first edge, the reconfigurable logic array further comprising a second storage region containing output data of an "M−1" functional block.

3. A reconfigurable logic array of claim 1, wherein said Mth functional block is configured for processing in a first direction and said second Mth functional block is configured for processing in a second direction opposite said first direction.

4. A reconfigurable logic array of claim 1, wherein the reconfigurable logic array further comprises a first storage region corresponding to each one of said first and second functions.

5. A reconfigurable logic array of claim 1, wherein said first and second functions share said first storage region.

* * * * *